March 14, 1961 L. P. HUNTER 2,975,085

TRANSISTOR STRUCTURES AND METHODS OF MANUFACTURING SAME

Filed Aug. 29, 1955 2 Sheets-Sheet 1

INVENTOR.
LLOYD P. HUNTER

BY [signature]

ATTORNEY

March 14, 1961 L. P. HUNTER 2,975,085

TRANSISTOR STRUCTURES AND METHODS OF MANUFACTURING SAME

Filed Aug. 29, 1955 2 Sheets-Sheet 2

*INVENTOR.*
LLOYD P. HUNTER
*BY* [signature]
ATTORNEY

United States Patent Office 2,975,085

Patented Mar. 14, 1961

2,975,085

TRANSISTOR STRUCTURES AND METHODS OF MANUFACTURING SAME

Lloyd P. Hunter, Poughkeepsie, N.Y., assignor to International Business Machines Corporation, New York, N.Y., a corporation of New York Filed Aug. 29, 1955, Ser. No. 531,103

4 Claims. (Cl. 148—33)

This invention relates to transistors and particularly to transistors having semi-conductive bodies including a region of intrinsic conductivity and N and P regions of extrinsic conductivity.

Junction transistors of the prior art have all included a region of one type of extrinsic conductivity between two other regions, both of which have the opposite type of extrinsic conductivity. Although it has been suggested to use an intrinsic region between two of the three extrinsic regions, it has been considered impossible to construct a transistor without these three extrinsic conductivity regions.

It has now been discovered that a transistor may be constructed having a region of intrinsic conductivity serving as a collector connection, so that only two extrinsic conductivity regions are required. Transistors according to the present invention may be referred to as PNI or NPI transistors, the I representing a region of intrinsic conductivity.

It has also been discovered that a junction between an intrinsic region and an extrinsic region can rectify and therefore such a junction can properly be called a barrier junction.

Junction transistors have commonly been made by first producing intrinsic germanium, and then introducing impurities into certain regions in controlled amounts to provide P-type or N-type regions. The previously known processes for producing such transistors require careful and delicate control. The present invention reduces the number of doping steps which must be used to make a transistor and thereby provides a substantial simplification of the manufacturing method, as well as providing higher quality of germanium with less compensation in the last grown regions.

An object of the present invention is to provide a PNI or NPI junction transistor.

Another object is to provide a method of manufacturing an NPI or NPI junction transistor.

The foregoing objects are attained by providing a semi-conductor device having two regions of opposite type conductivity separated by a barrier and a third region of intrinsic semi-conductor material contiguous to one of the two regions. This device is easier to manufacture than previous junction transistors as the following methods of manufacture will indicate.

One method of manufacture is to grow an NI or PI junction by starting with a melt of semi-conductor material from which a crystal of intrinsic semi-conductor material may be grown, and after growing a region of intrinsic material the melt is doped with sufficient N or P impurities so that as crystal growth continues the crystal will be of either N or P type conductivity, thus forming an ingot with an I layer and an N or P layer joined to the I layer at an NI or PI junction. The NI or PI junction so formed may then be cut out of the ingot, preferably with about .005" to .007" thickness of extrinsic material and about .08" thickness of intrinsic material. The junction may then be diced to form individual transistor bodies. The emitter junction for each transistor body is then formed by alloying-in a region of the opposite extrinsic conductivity type in the center of the layer of extrinsic material. The base contact in the transistor is made by soldering to a point on the extrinsic layer spaced from the center region. The collector connection is made by soldering to the surface of the intrinsic layer.

An alternative method of manufacture employs gaseous diffusion to diffuse appropriate impurities into a body of semi-conductive material.

Another alternative method involves the simultaneous thermal diffusion of two types of impurities into an intrinsic semi-conductor die.

Other objects and advantages of the invention will become apparent from a consideration of the following description and claims, taken together with the accompanying drawing.

Figure 1:
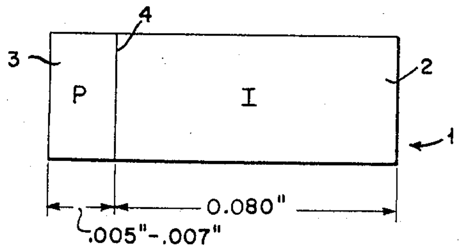
Fig. 1 is a diagrammatic view of a PI junction block whose formation is the first step in the manufacture of a transistor in accordance with the present invention.

Fig. 1 shows a body of semi-conductive material, generally indicated by the reference numeral 1 and comprising an intrinsic region 2 separated from a P region 3 by a barrier junction 4.

Figure 2:
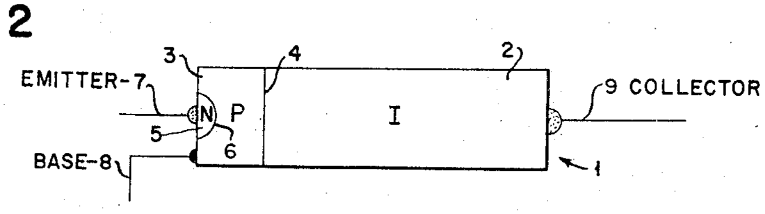
Fig. 2 is a diagrammatic illustration of a complete NPI transistor manufactured in accordance with the invention.

The body 1 is manufactured by forming a monocrystal of intrinsic semi-conductive material, for example, germanium, by the well known "pulling process," and doping a portion of the melt during the formation of the crystal so that one end of the material has P-type conductivity. The junction is then cut out of the monocrystal ingot and trimmed so that the P-region and the I-region have thicknesses substantially as indicated in Fig. 1, the P-region being about .005" to .007" thick and the I-region being about .08" thick. In Fig. 2, the semi-conductive body 1 has been further treated by alloying-in a region 5 of N-type material into the P-region 3, to provide a PN junction 6. An emitter connection 7 is then soldered to the N-region 5, a base connection 8 is soldered to the P-region 3 and a collector connection 9 is soldered to the intrinsic region 2. The transistor is then complete.

Figure 3:
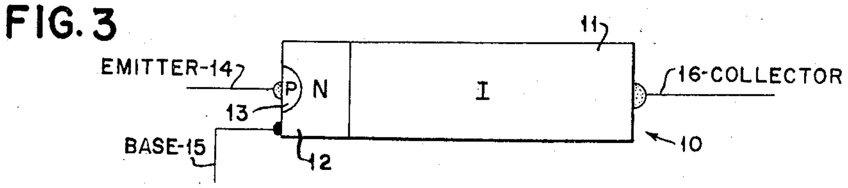
Fig. 3 is a diagrammatic illustration of a complete PNI transistor constructed in accordance with the invention.
Figure 4:
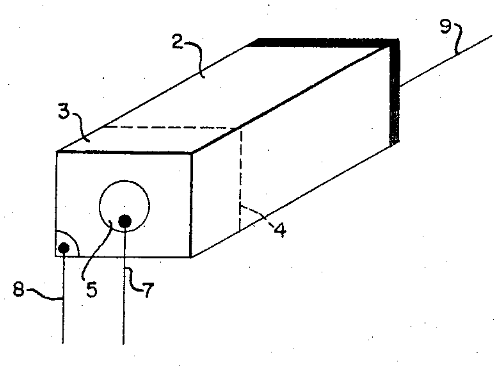
Fig. 4 is a perspective view of a transistor constructed in accordance with the invention.
Figure 5:
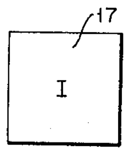
Fig. 5 is a diagrammatic view of a block of intrinsic material which is the starting material of a process according to a modification of the invention.
Figure 6:
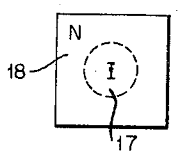
Fig. 6 is a diagrammatic view of the block of Fig. 5 after passing through the first step of the modified process.
Figure 7:
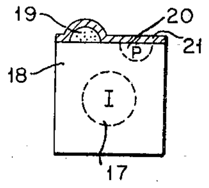
Fig. 7 is a diagrammatic view of the block of Fig. 6 after passing through certain further steps of the modified process.
Figure 8:
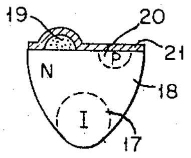
Fig. 8 is a diagrammatic view of the block of Fig. 7 after passing through another step.
Figure 9:
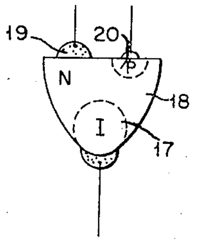
Fig. 9 is a diagrammatic view of a finished transistor constructed in accordance with the modified process of Figs. 5–8.

Alternatively, a PNI transistor may be constructed, as illustrated at 10 in Fig. 3, including an intrinsic region 11, an N-region 12 and a P-region 13. An emitter connection 14 is made to the P-region 13, a base connection 15 is made to the N-region 12 and a collector connection 16 is made to the intrinsic region I.

Calculations show that a transistor having an intrinsic collector region shows a fixed emitter input current gain of $$1+\frac{1}{b}$$

for the NPI structure and $1+b$ for the PNI structure. Such transistors have advantages of emitter input current gains greater than unity without the disadvantages of having their current gain affected by temperature, loading, etc.

The resistivity of the base region must be less than 10 ohm-centimeters, in order to create a reasonably high potential barrier for the collector. The resistivity of the intrinsic region is that of the semi-conductive material in its purest available form. For germanium, that resistivity runs about 45–55 ohm-centimeters at about room temperature.

The thickness of the base region should be not substantially greater than the diffusion length for the average lifetime of minority carriers in that region.

*Figs. 5 to 9*

These figures illustrate a gaseous diffusion method of making a transistor according to the present invention. A die 17 of intrinsic material is placed for a time in the presence of a vapor containing, for example, a material such as arsenic which acts as an N-type impurity, at a temperature of about 700° C. Under this treatment impurities from the vapor diffuse into the intrinsic material and form a layer 18 of N-type conductivity over all of the surfaces of the semi-conductor die. On one side of the die provision for an ohmic connection is made to the N-type layer by soldering as at 19, or electroplating, and on the same side a P-region 20 is alloyed into or electroplated onto the N-type layer. For example, the alloying process could be done by melting an indium dot. The side of the die having the P-region and the ohmic connection is then covered with an acid resistant coating 21 and the N-type layer is then completely etched away on all exposed sides of the die. The coating 21 is then removed, and leads are ohmically connected to the P-region 20, the ohmic connection 19 on the N-region and the intrinsic body 17. Suitable etching acids and acid resistant compounds for use with germanium are well known in the art.

Figure 10:
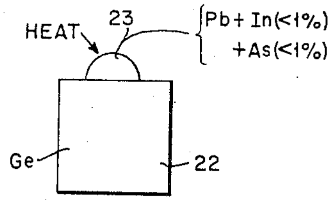
Fig. 10 is a diagrammatic view of the initial step of a process according to another modification of the invention.
Figure 11:
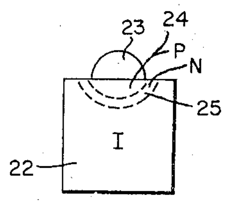
Fig. 11 is a diagrammatic view showing the process of Fig. 10 at a later stage.
Figure 12:
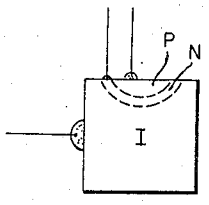
Fig. 12 is a diagrammatic view of a finished transistor constructed in accordance with the process of Figs. 10 and 11.

*Figs. 10 to 12*

These figures illustrate another method involving the simultaneous diffusion of two types of impurities into an intrinsic semi-conductor body 22. This may be done by applying to one side of the intrinsic semi-conductor body 22 a piece 23 of a metal having a melting temperature lower than the melting temperature of the semi-conductor material. This piece of metal, which may be, for example, lead or gold, is doped with two different impurities respectively capable of producing N and P type conductivity, for example, arsenic and indium. Heat is then applied to the metal and the impurities diffuse into the intrinsic semi-conductor body at different rates. In the example given, the arsenic diffuses more rapidly than the indium. The impurities convert the region 24 directly under the metal to P-type conductivity. Because of the more rapid rate of diffusion of the arsenic, a narrow region 25 of the material between the P-type and the original intrinsic material is converted to N-type. Since the metal piece 23 is applied to the surface of the intrinsic die, the diffusion mechanism also takes place along the surface. Hence, the N-type region appears at the surface. The metal 23 is then removed, and appropriate electrical connections to the respective region by methods known in the art produce a complete PNI transistor. By changing the specific impurities used in the processes of Figs. 5 to 9 and 10 to 12, NPI transistors may be produced.

While I have shown and described certain preferred embodiments of my invention, other modifications thereof will readily occur to those skilled in the art, and I therefore intend my invention to be limited only by the appended claims.

I claim:

1. A transistor consisting of a body of semi-conductive material including a region of intrinsic material, a first region of extrinsic material of one type joined to said intrinsic region by a barrier junction, a second region of extrinsic material of the opposite type joined to said first extrinsic region by a second barrier junction, an ohmic connection to said intrinsic region to serve as a collector electrode, an ohmic connection to said first extrinsic region to serve as a base electrode, and an ohmic connection to said second extrinsic region to serve as an emitter electrode.

2. A transistor as defined in claim 1, in which said first extrinsic region is N-type material, and said second extrinsic region is P-type material.

3. A transistor as defined in claim 1, in which said first extrinsic region is P-type material and said second extrinsic region is N-type material.

4. A transistor consisting of a body of semi-conductive material having first and second surfaces at opposite ends thereof, said body having a first region of intrinsically conductive material bounded in part by said first surface, a second region of extrinsically conductive material of one type bounded in part by said second surface, said regions being separated by a first barrier junction spaced from said second surface by a distance not substantially greater than the diffusion length for the average lifetime of minority carriers in said second region, and a third region of extrinsically conductive material of the type opposite to said second region, said third region being alloyed into said second region from a portion of said second surface and separated from said second region by a second barrier junction, an ohmic connection to said intrinsic region to serve as a collector electrode, an ohmic connection to said second region at said second surface to serve as a base electrode, and an ohmic connection to said third region at said portion of said second surface to serve as an emitter electrode.

References Cited in the file of this patent

UNITED STATES PATENTS

| | | |
|---|---|---|
| 2,623,105 | Shockley et al. | Dec. 23, 1952 |
| 2,703,296 | Teal | Mar. 1, 1955 |
| 2,708,646 | North | May 17, 1955 |
| 2,742,383 | Barnes | Apr. 17, 1956 |